(12) United States Patent
Li

(10) Patent No.: US 12,193,281 B2
(45) Date of Patent: Jan. 7, 2025

(54) OLED DISPLAY PANEL AND MANUFACTURING METHOD THEREOF

(71) Applicant: Everdisplay Optronics (Shanghai) Co., Ltd., Shanghai (CN)

(72) Inventor: Pengfei Li, Shanghai (CN)

(73) Assignee: Everdisplay Optronics (Shanghai) Co., Ltd, Shanghai (CN)

( * ) Notice: Subject to any disclaimer, the term of this patent is extended or adjusted under 35 U.S.C. 154(b) by 468 days.

(21) Appl. No.: 17/654,823

(22) Filed: Mar. 15, 2022

(65) Prior Publication Data
US 2022/0310738 A1  Sep. 29, 2022

(30) Foreign Application Priority Data

Mar. 25, 2021  (CN) .......................... 202110322598.6
Mar. 25, 2021  (CN) .......................... 202120610325.7

(51) Int. Cl.
*H10K 59/126*   (2023.01)
*H10K 50/80*    (2023.01)
*H10K 50/84*    (2023.01)
*H10K 59/40*    (2023.01)
*H10K 71/00*    (2023.01)
*H10K 71/20*    (2023.01)

(52) U.S. Cl.
CPC ......... *H10K 59/126* (2023.02); *H10K 50/841* (2023.02); *H10K 50/868* (2023.02); *H10K 59/40* (2023.02); *H10K 71/00* (2023.02); *H10K 71/233* (2023.02)

(58) Field of Classification Search
None
See application file for complete search history.

(56) References Cited

U.S. PATENT DOCUMENTS

2020/0357871 A1  11/2020  Chung et al.
2021/0256882 A1*  8/2021  Kim ....................... H04M 1/026

FOREIGN PATENT DOCUMENTS

| CN | 111211152 A  | 5/2020 |
| CN | 111668265 A  | 9/2020 |
| CN | 111933675 A  | 11/2020 |
| CN | 112002727 A  | 11/2020 |
| CN | 214203732 U  | 9/2021 |

OTHER PUBLICATIONS

1st Office Action dated Jun. 19, 2024 of Chinese Application No. 202110322598.6.

* cited by examiner

*Primary Examiner* — Kyoung Lee
(74) *Attorney, Agent, or Firm* — Qinghong Xu

(57) ABSTRACT

The present disclosure relates to the technical field of display devices, in particular to an OLED display panel and a manufacturing method thereof. The OLED display panel includes a display region and a blind hole region located in the display region disposed on a substrate, wherein the display region includes: a driving circuit arranged on the substrate; a light-emitting layer disposed above the driving circuit; and the blind hole region includes: an opening; traces arranged on the substrate and surrounding the opening; and a light-shielding layer disposed above the traces, wherein the traces and a part of the driving circuit are located on a film layer, and the light-shielding layer and another part of the driving circuit are located on another film layer.

13 Claims, 4 Drawing Sheets

OLED DISPLAY PANEL AND MANUFACTURING METHOD THEREOF

CROSS-REFERENCE TO RELATED APPLICATIONS

This application claims the priorities of the Chinese Patent Application No. 202110322598.6, filed with China National Intellectual Property Administration on Mar. 25, 2021 and the Chinese Patent Application No. 202120610325.7, filed with China National Intellectual Property Administration on Mar. 25, 2021, the contents of which are herein incorporated by reference in their entireties.

TECHNICAL FIELD

The present disclosure relates to the technical field of display devices, in particular to an OLED display panel and a manufacturing method thereof.

BACKGROUND

In an Organic Light-Emitting Diode (OLED) display panel, a camera is accommodated in a blind hole disposed in a display region. Around the blind hole, there is a trace region. Furthermore, on the surface of an encapsulating glass used to encapsulate the display module, a light-shielding metal layer is disposed at a position corresponding to the trace region. The light-shielding metal layer is used to prevent external light from affecting the lighting of the camera.

However, in actual use, it is found that some external light still bypasses the light-shielding metal layer and irradiates the trace region, and then scatters into the camera, thus interfering with the lighting of the camera. In addition, a touch film layer needs to be disposed above the surface of the encapsulating glass, and the compatibility problem between the light-shielding metal layer and the touch film layer needs to be considered, thereby increasing the difficulty of the manufacturing process of the OLED display panel.

It should be noted that the information disclosed in the above Background section is only for enhancing understanding of the background of the present disclosure, and therefore may include information that does not form the prior art known to a person of ordinary skill in the art.

SUMMARY

According to one aspect of the present disclosure, an OLED display panel is provided. The OLED display panel may include a display region and a blind hole region located in the display region disposed on a substrate, wherein the display region includes: a driving circuit arranged on the substrate; and a light-emitting layer disposed above the driving circuit; and the blind hole region includes: an opening; traces arranged on the substrate and surrounding the opening; and a light-shielding layer disposed above the traces, wherein the traces and a part of the driving circuit are located on a film layer, and the light-shielding layer and another part of the driving circuit are located on another film layer.

According to another aspect of the present disclosure, a method for manufacturing an OLED display panel is provided. The method may include: providing a substrate, wherein a display region and a blind hole region located in the display region are disposed on the substrate, and an opening is formed in the blind hole region; forming a driving circuit located in the display region, traces located in the blind hole region and surrounding the opening, and a light shielding layer located above the traces by performing a patterning process on the substrate, wherein the traces and a part of the driving circuit are located on a film layer, and the light-shielding layer and another part of the driving circuit are located on another film layer; forming a light-emitting layer over the driving circuit.

It should be understood that the above general description and the following detailed description are only exemplary and explanatory, and cannot limit the present disclosure.

BRIEF DESCRIPTION OF THE DRAWINGS

The drawings here are incorporated into the specification and constitute a part of the specification, show embodiments in accordance with the present disclosure and are used to explain the principle of the present disclosure together with the specification. Obviously, the drawings in the following description are only some embodiments of the present disclosure. For those of ordinary skill in the art, other drawings can be obtained based on these drawings without creative work.

DETAILED DESCRIPTION

Figure 1:
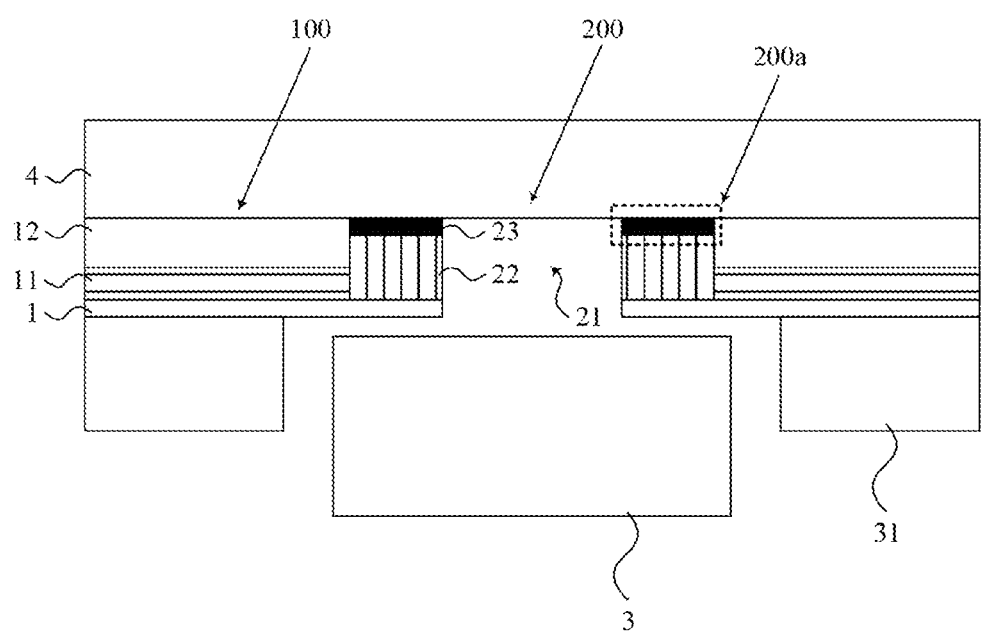
FIG. 1 shows a schematic structural diagram of an OLED display panel according to some embodiments of the present disclosure.

Example embodiments will now be described more fully with reference to the accompanying drawings. However, example embodiments can be embodied in various forms and should not be construed as limited to the embodiments set forth herein. Rather, these embodiments are provided so that this disclosure will be thorough and complete, and will fully convey the concept of example embodiments to those skilled in the art.

The drawings are merely schematic illustrations of the present disclosure and are not necessarily drawn to scale. The same reference numerals in the drawings denote the same or similar parts, and thus their repeated descriptions will be omitted. Some of the block diagrams shown in the figures are functional entities, which do not necessarily correspond to physically or logically separate entities. These functional entities may be implemented in software, or in one or more hardware modules or integrated circuits, or in different networks and/or processor devices and/or microcontroller devices.

In addition, the flow shown in the drawings is only an exemplary illustration, and does not necessarily include all steps. For example, some steps can be decomposed, and some steps can be combined or partially combined, and the actual execution order may be changed according to the actual situation. It should be noted that the embodiments of the present disclosure and features in different embodiments may be combined with each other under the condition of no conflict.

FIG. 1 shows a main structure of an OLED display panel in some embodiments. Referring to FIG. 1, the OLED display panel according to some embodiments of the present disclosure includes a display region 100 and a blind hole region 200 located in the display region 100 disposed on a substrate 1. The display region 100 includes: a driving circuit 11, which is arranged on the substrate 1; and a light-emitting layer 12, which is arranged above the driving circuit 11. The blind hole region 200 includes an opening 21, traces 22, and a light shielding layer 23. The traces are arranged on the substrate 1, and around the opening 21. The light shielding layer 23 is disposed above the traces 22 and the traces 22 and a part of the driving circuit 11 are located on the same film layer, and the light shielding layer 23 and another part of the driving circuit 11 are located on the another same film layer.

The driving circuit 11 is fabricated and formed by an array substrate manufacturing process. The structure design that the traces 22 and the light shielding layer 23 are respectively located in the same film layer with corresponding parts of the driving circuit 11 can realize that in the process of manufacturing the driving circuit 11 on the substrate 1, the fabrication of the light shielding layer 23 is simultaneously completed by using the array substrate manufacturing process, thereby simplifying the manufacturing process of the OLED display panel.

In some embodiments, the array substrate manufacturing process includes multi-steps photolithography steps, i.e., each photolithography step has a plurality of steps, and the driving circuit 11 is formed by stacking multiple layers, which will be described in detail below in conjunction with the manufacturing method of the OLED display panel. The formation of the light shielding layer 23 only needs to, in a certain photolithography step of the array substrate manufacturing process, add a pattern suitable for forming the light shielding layer 23 and corresponding to the blind hole region 200 to a photo-mask design. That is, the traces 22 and the light-shielding layer 23 are respectively located in the same film layer with corresponding parts of the driving circuit 11. Specifically, the formation of the traces 22 and the formation of a part of the driving circuit 11, and the formation of the light-shielding layer 23 and the formation of another part of the driving circuit 11 are completed by a same photolithography process, and the photolithography process may include one or more photolithography steps.

In some embodiments, the driving circuit 11 may use a Low Temperature Poly-Silicon (LTPS, for short) type thin film transistor (TFT, for short), so that the substrate 1 is formed as a low temperature polysilicon thin film transistor (LTPS-TFT) array substrate.

In some embodiments, the light-emitting layer 12 includes a light-emitting material layer, an auxiliary light-emitting layer (e.g., a hole transport layer, an electron transport layer, etc.) and a cathode material layer, and the light-emitting layer 12 and the driving circuit 11 form a light-emitting device.

The blind hole region 200 is used for setting the camera 3. Specifically, the camera 3 corresponds to the blind hole region 200 and is disposed on a side of the substrate 1 away from the display region 100, that is, under the substrate 1, and a lens group (not shown in the FIG. 1) of the camera 3 is located in a light-transmitting region of the opening 21. By using the structural design that the light-shielding layer 23 is disposed above the traces 22 of the blind hole region 200, the effect of completely blocking the external stray light can be achieved. The external stray light cannot irradiate to the traces 22 by bypassing the light-shielding layer 23, thereby avoiding the lighting of the camera 3 is disturbed, so that there is no light leakage in the region of opening 21.

Under the substrate 1, a foam structure 31 is further provided on the periphery of the blind hole region 200, and a diameter of the foam structure 31 is slightly larger than that of the blind hole region 200.

The traces 22 are also formed by the array substrate manufacturing process. In fact, the traces 22 are also a part of the driving circuit structure of the OLED display panel, that is, by using the array substrate manufacturing process, the driving circuit 11 arranged in the display region 100 and the traces 22 arranged in the blind hole region 200 are both formed on the substrate 1. The specific circuit structures of the driving circuit 11 and the traces 22 are different, and the required photolithography steps are also different, which will be described in detail below in conjunction with the manufacturing method of the OLED display panel. Generally, the specific circuit structure of the traces 22 is simpler than that of the driving circuit 11, so the photolithography steps required to manufacture the traces 22 are less than the photolithography steps required to manufacture the driving circuit 11. Therefore, after the photolithography steps of manufacturing the traces, the photolithography steps of manufacturing the driving circuit 11 are continued, and then the manufacture of the light shielding layer 23 can be realized simultaneously.

Figure 2:
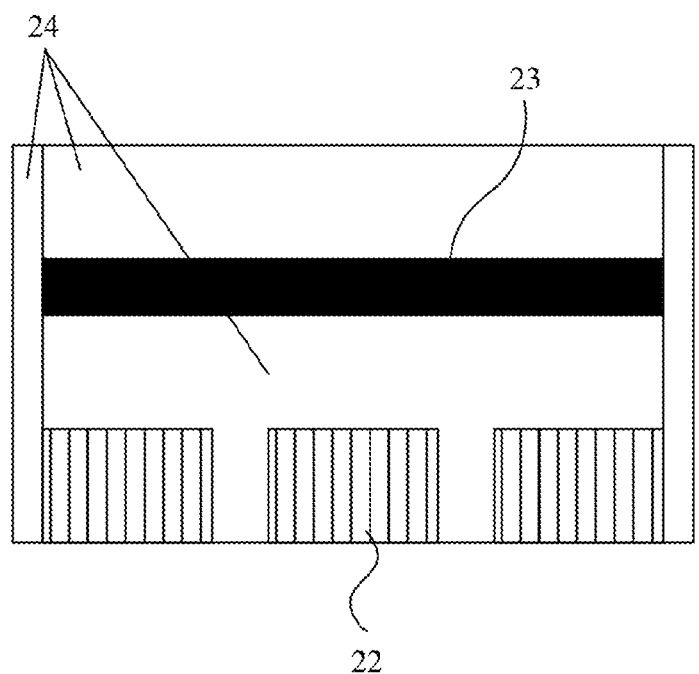
FIG. 2 shows a schematic diagram of a partially enlarged structure of a blind hole region according to some embodiments of the present disclosure.

FIG. 2 shows a partial enlarged structure of the blind hole region 200 in some embodiments, which is the enlarged structure of the region 200a shown by the dotted line box in FIG. 1. Referring to FIG. 2, the blind hole region further includes: a photoresist 24 disposed between the light shielding layer 23 and the traces 22, on an upper surface of the light shielding layer 23, and on side surfaces of the light shielding layer 23 and the traces 22. The light shielding layer 23 is specifically formed as an indium tin oxide-silver-indium tin oxide (ITO-Ag-ITO) composite film.

In other embodiments, the light-shielding layer 23 may also be formed as other metal material layers, as long as the light-shielding effect can be achieved.

Further, referring to FIG. 1, the blind hole region 200 is flush with the display region 100 in a height direction. The OLED display panel further includes: an encapsulation glass 4 covering above the display region 100 and the blind hole region 200. In the present embodiments, the design of the light-shielding metal layer on the surface of the encapsulation glass 4 is eliminated, so that it is not necessary to consider compatibility with the touch design on the surface of the encapsulation glass 4, which can simplify the manufacturing process of the OLED panel and realize the independence between the array substrate manufacturing process and the touch design, which is beneficial to the diversity of touch design.

Figure 3:
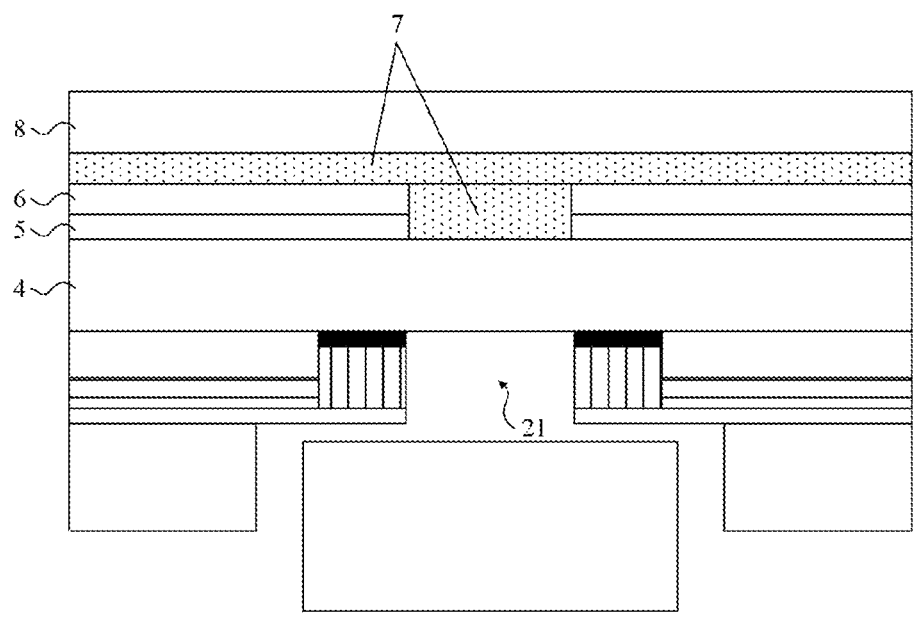
FIG. 3 shows a schematic structural diagram of an OLED display panel according to some embodiments of the present disclosure.

FIG. 3 shows a main structure of the OLED display panel according to some embodiments. Referring to FIG. 3, in this embodiment, the OLED display panel further includes a touch layer 5, a polarizing layer 6, and a cover-plate glass 8.

The touch layer 5 is disposed on an upper surface of the encapsulation glass 4.

The polarizing layer 6 is disposed on an upper surface of the touch layer 5. The touch layer 5 and the polarizing layer 6 are provided with a hollow structure at a position corresponding to the opening 21, and the hollow structure is filled with transparent optical glue 7.

The cover-plate glass 8 is glued to an upper surface of the polarizing layer 6 through the transparent optical glue 7.

Of course, the structure of the OLED display panel is not limited to that shown in FIG. 3. For example, in some embodiments, the structure and position of the touch layer 5 can be adjusted as required.

Embodiments of the present disclosure also provide a method for manufacturing an OLED display panel, which can be used to manufacture the OLED display panel of any of the foregoing embodiments. The features and principles of the OLED display panel described in any of the above embodiments can be applied to the following manufacturing method embodiments. In the following manufacturing method embodiments, the features and principles of the OLED display panel that have already been clarified will not be repeated.

Figure 4:
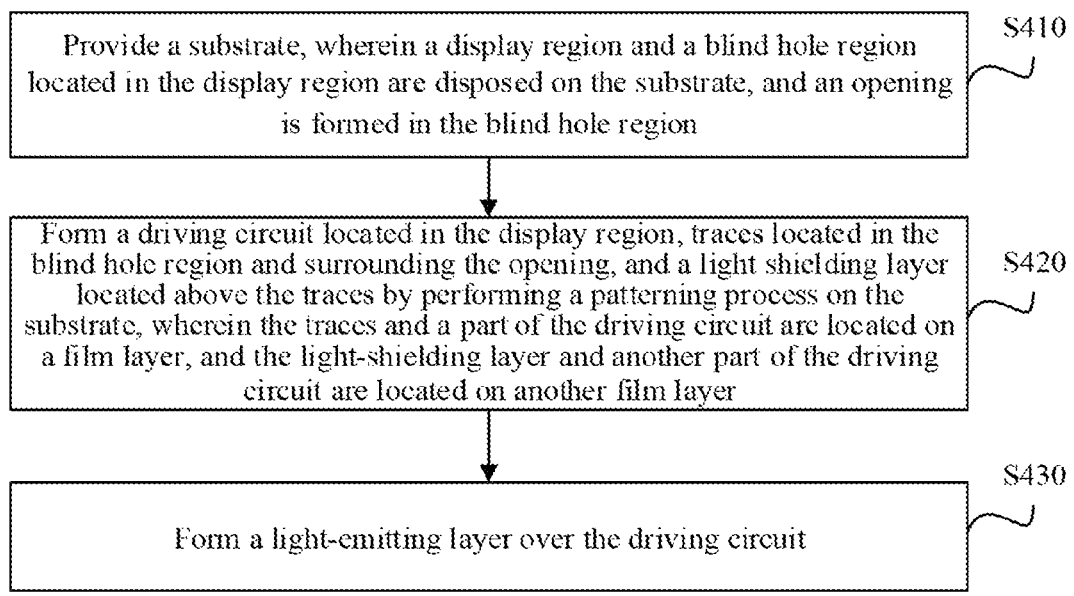
FIG. 4 shows a schematic diagram of steps of a method for manufacturing an OLED display panel according to some embodiments of the present disclosure.

FIG. 4 shows main steps of a method for manufacturing an OLED display panel according to some embodiments. The manufacturing method of this embodiment can be used to form the OLED display panel shown in FIG. 1. Referring to FIG. 1 and FIG. 4, the manufacturing method of the OLED display panel includes the following steps.

In step S410, a substrate 1 is provided, a display region 100 and a blind hole region 200 located in the display region 100 are disposed on the substrate 1. The blind hole region 200 is formed with an opening 21.

In step S420, a patterning process is performed on the substrate 1 to form a driving circuit 11 located in the display region 100, the traces 22 located in the blind hole region 200 and surrounding the opening 21, and the light shielding layer 23 located above the traces 22. Furthermore, the traces 22 and the light shielding layer 23 are respectively formed on the same film layer with the corresponding parts of the driving circuit 11.

In step S430, the light emitting layer 12 is formed over the driving circuit 11.

Therefore, using the array substrate manufacturing process, that is, the patterning process performed on the substrate 1, the driving circuit 11 located in the display region 100, the traces 22 and the light shielding layer 23 located in the blind hole region 200 are formed, which simplifies the manufacturing process of the OLED display panel, and achieve a complete blocking effect of external stray light.

In some embodiments, the patterning process specifically includes multi-steps photolithography steps. The specific circuit structure of the traces 22 is simpler than that of the driving circuit 11, so the formation of the traces 22 is earlier than that of the driving circuit 11. Therefore, in one next photolithography step after forming the traces 22, the forming of the driving circuit 11 in the display region 100 can be continued, and the forming of the light shielding layer 23 in the blind hole region 200 can be continued at the same time.

Each photolithography step specifically includes: depositing a thin film in a preset region; coating a photoresist on an upper surface of the thin film; exposing and developing the photoresist via a photo-mask having a preset pattern to form a photoresist layer with the preset pattern, wherein the preset pattern corresponding to the display region 100 and the preset pattern corresponding to the blind hole region 200 are different according to the specific circuit structures of the display region 100 and the blind hole region 200; etching a portion of the thin film not being covered by the photoresist layer; stripping the photoresist layer to form a thin film layer with the preset pattern.

Furthermore, as shown in FIG. 2, the photoresist 24 is retained between the light shielding layer 23 and the traces 22 in the blind hole region 200, and the photoresist 24 is also formed on the upper surface of the light shielding layer 23 and the side surfaces of the light shielding layer 23 and the traces 22. For example, the photoresist 24 can be specifically formed by the following methods. Since an eight-steps photolithography step is required to form the driving circuit 11, a three-steps photolithography step is required to form the traces 22, and a one-step photolithography step is required to form the light shielding layer 23, then in the first three photolithography step of the eight-steps photolithography step, i.e., three-steps photolithography step, a part of the driving circuit 11 is formed in the display region 100 and at the same time traces 22 are formed in the blind hole region 200. In the process of stripping the photoresist layer of a third step of the three-steps photolithography step, the photoresist 24 between the patterns of traces 22, on the side surface of the trace 22 and the upper surface of the trace 22 is retained; and then the fourth photolithography step of the eight-steps photolithography step is continued, in which a part of the driving circuit 11 is formed in the display region 100 and at the same time the light shielding layer 23 is formed in the blind hole region 200. In the process of stripping the photoresist layer in the fourth photolithography step, the photoresist 24 on the side surface and the upper surface of the light shielding layer 23 is retained; subsequently, the complete driving circuit 11 is formed in the display region 100 through the next four photolithography steps of the eight-steps photolithography step, and the traces 22 and the light shielding layer 23 formed in the blind hole region 200 are protected by the photoresist 24.

Of course, the above examples are only schematic illustrations. In different embodiments, depending on the specific circuit structures of the driving circuit 11 and the traces 22, the patterning process on the substrate 1 can be flexibly adjusted. For example, the formation of the light shielding layer 23 only needs in one next photolithography step after forming the traces 22, adding a pattern suitable for forming the light shielding layer 23 and corresponding to the blind hole region 200 to the photo-mask design.

Continuing to refer to FIG. 1, after the driving circuit 11 is formed, the light-emitting layer 12 is formed by evaporating a light-emitting material over the driving circuit 11. After the light emitting layer 12 is formed, the display region 100 and the blind hole region 200 are flush with each other in the height direction. The manufacturing method of the OLED display panel further includes: forming the encapsulation glass 4 over the display region 100 and the blind hole region 200.

Further, as shown in FIG. 3, the manufacturing method of the OLED display panel may further include: forming the touch layer 5, the polarizing layer 6, the cover-plate glass 8 and other structures above the encapsulating glass 4 according to specific needs, which are not repeated here.

To sum up, the OLED display panel and the manufacturing method thereof described in the various embodiments of the present disclosure can completely block the external stray light by disposing the light shielding layer above the traces in the blind hole region. Furthermore, it is impossible for the external stray light to bypass the light shielding layer to irradiate or reach to the traces, thus preventing the camera from being disturbed by lighting, and achieving no light leakage in the opening region. In addition, the traces and a part of the driving circuit are located in the same film layer and light-shielding layer and another part of the driving circuit are located in another same film layer, so as to realize that in the process of manufacturing the driving circuit on the substrate, the fabrication of the light-shielding layer is completed simultaneously by using the array substrate manufacturing process, thus simplifying the manufacturing process of the OLED display panel. The technical scheme of the present disclosure also realizes the independence of the array substrate manufacturing process and the touch design, which is beneficial to the diversity of the touch design.

In view of this, the present disclosure provides an OLED display panel and a manufacturing method thereof, which can achieve the effect of completely blocking external stray light and simplify the manufacturing process of the OLED display panel.

In some embodiments of the present disclosure, an OLED display panel is provided. The OLED display panel may include a display region and a blind hole region located in the display region disposed on a substrate, wherein the display region includes: a driving circuit arranged on the substrate; and a light-emitting layer disposed above the driving circuit; and the blind hole region includes: an opening; traces arranged on the substrate and surrounding the opening; and a light-shielding layer disposed above the traces, wherein the traces and a part of the driving circuit are located on a film layer, and the light-shielding layer and another part of the driving circuit are located on another film layer.

In some embodiments, the blind hole region further includes a photoresist, wherein the photoresist is arranged between the light shielding layer and the traces, on an upper surface of the light shielding layer, and on side surfaces of the light shielding layer and the traces.

In some embodiments, the blind hole region is flush with the display region in a height direction; wherein the OLED display panel further includes an encapsulating glass, and the encapsulating glass covers above the display region and the blind hole region.

In some embodiments, the OLED display panel further includes a touch layer disposed on an upper surface of the encapsulation glass.

In some embodiments, the OLED display panel further includes a polarizing layer disposed on an upper surface of the touch layer, wherein the touch layer and the polarizing layer are provided with a hollow structure at a position corresponding to the opening, and the hollow structure is filled with transparent optical glue; and a cover-plate glass glued on an upper surface of the polarizing layer through the transparent optical glue.

In some embodiments, the OLED display panel further includes a camera, disposed on a side of the substrate away from the display region and being corresponding to the blind hole region, wherein a lens group of the camera is located in a light-transmitting region of the opening.

In some embodiments, the light shielding layer is formed as an indium tin oxide-silver-indium tin oxide composite film.

In some embodiments, the substrate is formed as a transistor array substrate having a low temperature polysilicon thin film.

In some embodiments of the present disclosure, a method for manufacturing an OLED display panel is provided. The method may include: providing a substrate, wherein a display region and a blind hole region located in the display region are disposed on the substrate, and an opening is formed in the blind hole region; forming a driving circuit located in the display region, traces located in the blind hole region and surrounding the opening, and a light shielding layer located above the traces by performing a patterning process on the substrate, wherein the traces and a part of the driving circuit are located on a film layer, and the light-shielding layer and another part of the driving circuit are located on another film layer; forming a light-emitting layer over the driving circuit.

In some embodiments, the patterning process includes multi-steps photolithography steps; wherein, a formation of the traces is earlier than a formation of the driving circuit; wherein, in a next photolithography step after forming the traces, the forming of the driving circuit in the display region is continued and at the same time the forming of the light shielding layer in the blind hole region is continued.

In some embodiments, a photoresist is retained between the light shielding layer and the traces; and the photoresist is formed on an upper surface of the light shielding layer, and side surfaces of the light shielding layer and the traces.

In some embodiments, each of the multi-steps photolithography steps includes: depositing a thin film in a preset region; coating a photoresist on an upper surface of the thin film, and forming a photoresist layer with a preset pattern by exposing and developing the photoresist via a photo-mask having the preset pattern; etching a portion of the thin film not being covered by the photoresist layer; and forming a thin film layer having the preset pattern photoresist by stripping the photoresist layer.

In some embodiments, after forming the light-emitting layer, the display region and the blind hole region are flush with each other in a height direction; wherein the method further includes: forming an encapsulation glass over the display region and the blind hole region.

The beneficial effects of the present application compared with the prior art at least include that a complete blocking effect on external stray light is achieved by arranging the shielding layer above the traces in the blind hole region; and the external stray light cannot bypass the shading layer to irradiate the traces, so that there is no light leakage through the opening, and the lighting of the camera is prevented from being disturbed.

Furthermore, by placing the traces and a part of the driving circuit in the same film layer and placing the light-shielding layer and another part of the driving circuit in another same film layer, in the process of fabricating the driving circuit on the substrate, the fabrication of the light-shielding layer is completed synchronously by using the array substrate manufacturing process, which simplifies the manufacturing process of OLED display panel, and the array substrate and the touch design are independent of each other, which is beneficial to the diversity of the touch design.

The above content is a further detailed description of the present disclosure in combination with specific preferred embodiments, and it cannot be considered that the specific implementation of the present disclosure is limited to these descriptions. For those of ordinary skill in the technical field of the present disclosure, without departing from the concept of the present disclosure, some simple deductions or substitutions can be made, which should be regarded as belonging to the protection scope of the present disclosure.

What is claimed is:

1. An OLED display panel, comprising a display region and a blind hole region located in the display region disposed on a substrate,
    wherein the display region comprises:
        a driving circuit arranged on the substrate; and
        a light-emitting layer disposed above the driving circuit; and
    the blind hole region comprises:
        an opening;
        traces arranged on the substrate and surrounding the opening; and a light-shielding layer disposed above the traces,
wherein the traces and a part of the driving circuit are located on a first film layer, and the light-shielding layer and another part of the driving circuit are located on a second film layer.

2. The OLED display panel according to claim 1, wherein the blind hole region further comprises a photoresist,
wherein the photoresist is arranged between the light shielding layer and the traces, on an upper surface of the light shielding layer, and on side surfaces of the light shielding layer and the traces.

3. The OLED display panel according to claim 1, wherein the blind hole region is flush with the display region in a height direction.

4. The OLED display panel according to claim 3, further comprising:
an encapsulating glass disposed above the display region and the blind hole region; and
a touch layer disposed on an upper surface of the encapsulation glass.

5. The OLED display panel according to claim 4, further comprising:
a polarizing layer disposed on an upper surface of the touch layer, wherein the touch layer and the polarizing layer are provided with a hollow structure at a position corresponding to the opening, and the hollow structure is filled with transparent optical glue; and
a cover-plate glass glued on an upper surface of the polarizing layer through the transparent optical glue.

6. The OLED display panel according to claim 1, further comprising:
a camera, disposed on a side of the substrate away from the display region and being corresponding to the blind hole region,
wherein a lens group of the camera is located in a light-transmitting region of the opening.

7. The OLED display panel according to claim 1, wherein the light shielding layer is formed as an indium tin oxide-silver-indium tin oxide composite film.

8. The OLED display panel according to claim 1, wherein the substrate is formed as a transistor array substrate having a low temperature polysilicon thin film.

9. A method for manufacturing an OLED display panel, comprising:
providing a substrate, wherein a display region and a blind hole region located in the display region are disposed on the substrate, and an opening is formed in the blind hole region;
forming a driving circuit located in the display region, traces located in the blind hole region and surrounding the opening, and a light shielding layer located above the traces by performing a patterning process on the substrate, wherein the traces and a part of the driving circuit are located on a first film layer, and the light-shielding layer and another part of the driving circuit are located on a second film layer;
forming a light-emitting layer over the driving circuit.

10. The manufacturing method according to claim 9, wherein the patterning process comprises multi-steps photolithography steps;
wherein, a formation of the traces is earlier than a formation of the driving circuit;
wherein, in a next photolithography step after forming the traces, the forming of the driving circuit in the display region is continued and at the same time the light shielding layer in the blind hole region is formed.

11. The manufacturing method according to claim 10, wherein a photoresist is retained between the light shielding layer and the traces; and
the photoresist is formed on an upper surface of the light shielding layer, and side surfaces of the light shielding layer and the traces.

12. The method according to claim 10, wherein each of the multi-steps photolithography steps comprises:
depositing a thin film in a preset region;
coating a photoresist on an upper surface of the thin film, and forming a photoresist layer with a preset pattern by exposing and developing the photoresist via a photomask having the preset pattern;
etching a portion of the thin film not being covered by the photoresist layer;
forming a thin film layer having the preset pattern photoresist by stripping the photoresist layer.

13. The manufacturing method according to claim 9, wherein after forming the light-emitting layer, the display region and the blind hole region are flush with each other in a height direction.

* * * * *